United States Patent [19]

Irving et al.

[11] Patent Number: 4,634,644

[45] Date of Patent: Jan. 6, 1987

[54] PROCESS FOR THE PRODUCTION IMAGES USING SEQUENTIALLY GASEOUS POLYMERIZING AGENTS AND PHOTOCURING

[75] Inventors: Edward Irving, Burwell; Terence J. Smith, Royston, both of England

[73] Assignee: Ciba-Geigy Corporation, Ardsley, N.Y.

[21] Appl. No.: 679,973

[22] Filed: Dec. 10, 1984

[30] Foreign Application Priority Data

Dec. 20, 1983 [GB] United Kingdom ............. 8333853

[51] Int. Cl.$^4$ ................................................ G03C 5/16
[52] U.S. Cl. ............................... 430/18; 430/327; 430/325; 430/280; 430/270; 430/286; 430/287; 528/113; 522/103; 522/162
[58] Field of Search ............. 430/327, 325, 280, 270, 430/286, 287, 18; 528/113; 522/103, 162

[56] References Cited

U.S. PATENT DOCUMENTS

| | | |
|---|---|---|
| 2,710,815 | 6/1955 | Young et al. |
| 3,085,897 | 4/1963 | Priest et al. ............. 117/34 |
| 4,058,400 | 11/1977 | Crivello ............. 204/159.18 |
| 4,058,401 | 11/1977 | Crivello ............. 204/159.22 |
| 4,073,975 | 2/1978 | Buckwalter et al. ............. 427/170 |
| 4,138,299 | 2/1979 | Bolgiano ............. 427/44 X |
| 4,173,682 | 11/1979 | Noomen et al. ............. 428/423 |
| 4,289,798 | 9/1981 | Bagley et al. ............. 427/39 |
| 4,291,118 | 9/1981 | Boduch et al. ............. 430/327 |
| 4,299,938 | 11/1981 | Green et al. ............. 204/159.24 |
| 4,339,567 | 7/1982 | Green et al. ............. 204/159.11 |
| 4,343,839 | 8/1982 | Blegen ............. 427/340 |
| 4,343,924 | 8/1982 | Linden ............. 427/388.2 |
| 4,368,222 | 1/1983 | Blegen et al. ............. 427/340 |
| 4,374,181 | 2/1983 | Blegen ............. 428/423.3 |
| 4,383,025 | 5/1983 | Green et al. ............. 430/280 |
| 4,389,433 | 6/1983 | Pampalone ............. 427/342 X |
| 4,408,034 | 10/1983 | Kazama et al. ............. 528/54 |
| 4,413,052 | 11/1983 | Green et al. ............. 430/327 |
| 4,439,509 | 3/1984 | Schank . |
| 4,500,629 | 2/1985 | Irving et al. ............. 430/327 |

FOREIGN PATENT DOCUMENTS

| | | |
|---|---|---|
| 0122427 | 10/1978 | Japan ............. 430/327 |
| 1293722 | 10/1972 | United Kingdom . |
| 1351881 | 5/1974 | United Kingdom . |
| 1369351 | 10/1974 | United Kingdom . |

*Primary Examiner*—Roland E. Martin
*Assistant Examiner*—Cynthia Hamilton
*Attorney, Agent, or Firm*—Luther A. R. Hall

[57] ABSTRACT

A layer of a liquid composition containing a residue that is polymerizable on contact with a gaseous polymerizing agent and a photocurable residue, which residues may be on the same or different molecules, is contained with a gaseous polymerizing agent so that the layer solidifies but remains photocurable. Subsequently the solidified layer is exposed to actinic radiation in a predetermined pattern and those parts of the layer that are not photocured are removed by treatment with a suitable solvent.

Typical polymerizable residues include cyanoacrylates that polymerize on exposure to water vapor, ammonia, or an amine. Typical photocurable residues include acrylates, and methacrylates.

The process is suitable for the manufacture of printing plates and printed circuits.

20 Claims, No Drawings

PROCESS FOR THE PRODUCTION IMAGES USING SEQUENTIALLY GASEOUS POLYMERIZING AGENTS AND PHOTOCURING

This invention relates to a process for the production of images by vapour permeation followed by exposure to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through a negative whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation, without the use of organic solvents. Not only would, in this stage, the use be avoided of solvents which might present problems of flammability and cause expense in their recovery, but the production on a continuous basis of coated supports, ready for irradiation, would be facilitated.

We have found that this object can be achieved by the use of certain liquid compositions which contain groups through which vapour permeation polymerisation and photocuring can occur. These groups may form part of the same molecule, or they may form part of different molecules. The groups are chosen so that vapour permeation polymerisation of a layer of a liquid composition occurs rapidly to form a solid, essentially tack-free layer, which is, however, still soluble in certain solvents. When desired, a part or parts of the layer are subjected to actinic radiation and photocuring takes place in the already polymerised layer, the parts of the layer which undergo photocuring becoming much more resistant to solution in the solvent.

U.S. Pat. No. 4,291,118 relates to a method for forming relief images from a film of a liquid photopolymerisable material, comprising exposing the film to chemical hardening treatment sufficiently to solidify it, then treating the solidified film in a pattern in a manner differentiating the chemical condition of the film in the pattern as distinct from the chemical condition of the solidified mass not in the pattern, and then selectively removing the portion of the mass in one of the chemical conditions leaving that portion of the mass in the other chemical condition to form a relief image. To bring about the differentiation in chemical condition actinic radiation is used in all the embodiments described.

In the process described in this U.S. patent, therefore, the film of liquid material is exposed to actinic radiation and then the solidified film is re-exposed to actinic radiation in the form of a pattern so that a part or parts of it become less easily removed by a solvent, and finally the image is developed by washing away with the solvent the more readily removed part or parts, i.e., those which were not re-exposed.

The conditions of exposure have to be carefully controlled; if the first exposure is insufficient, the solidifed material remains tacky and inconvenient to handle whereas if it is excessive, images of poor definition are obtained.

Only the use of photopolymerisable polyene-polythiol compositions is described. In the context of the process described in the U.S. patent, these have the disadvantage that the polymerisation which is initiated on exposure to actinic radiation continues when such exposure is interrupted. It follows that if images of good quality are to be obtained the second irradiation stage must be performed without delay. This is a constraint on industrial utilisation of the process.

Vapour permeation curing is a known process whereby a liquid polymerisable composition is exposed to the vapour of a reagent which reacts with the composition or catalyses its cure, thus converting it from the liquid to the solid state. The vapour is generally that of ammonia or an amine and the polymerisable composition usually comprises a polyisocyanate and a polyol. In U.S. Pat. No. 4,343,839, for example, there is disclosed a coating composition comprising (A) an aromatic hydroxyfunctional condensation product, (B) a polyisocyanate, (C) a volatile organic solvent for (A) and (B), and (D) an anti-abrasion component. These compositions cure rapidly when exposed to the vapour of a tertiary amine, giving high gloss, transparent, and flexible coatings.

U.S. Pat. No. 4,343,924 describes a method of coating substrates using (a) a phenol-functional condensate, (b) a polyisocyanate, and (c) an organic solvent. These coatings cure rapidly when exposed to the vapour of a tertiary amine catalyst.

U.S. Pat. No. 4,368,222 describes a method of coating porous substrates by application of a thermosetting composition comprising an aromatic hydroxylated compound and a polyisocyanate hardener, and exposing the coated substrate to a tertiary amine vapour. U.S. Pat. No. 4,374,181 describes coating compositions comprising a hydroxy-aromatic product, a polyisocyanate hardener, and an organic solvent, which are hardened at room temperature by exposure to a tertiary amine in vapour form. The coatings are stated to be of use on reaction injection-moulded articles, particularly flexible polyurethane articles such as vehicle bumpers or vinyl upholstery.

British Patent Specification No. 1 351 881 describes compositions that cure upon contact with amines, especially amines in the vapour state, comprising a polyisocyanate and the reaction product, having free phenolic hydroxyl groups, of (1) a phenolaldehyde condensate, and (2) a compound containing two or more functional groups selected from epoxide, hydroxyl, and carboxylic acid groups.

British Patent Specification No. 1 369 351 disclosed compositions that cure on contact with amines especially in vapour form, comprising a polyisocyanate and a component having free hydroxy or epoxy groups capped with a diphenolic acid having the general formula

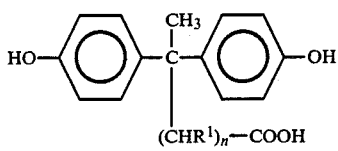

in which R[1] represents a hydrogen atom or an alkyl group, and n is an integer of from 1 to 8, this acid optionally being in the form of its ester when used to cap a free hydroxy component.

British Patent Application No. 2 093 049 describes a method of curing compounds containing at least two isocyanate groups linked to an aromatic nucleus through a methylene group of an isocyanate-terminated urethane resin, which comprises treatment with the vapour of a tertiary amine.

The use of both irradiation and vapour permeation curing is described in U.S. Pat. No. 4,173,682, in which are described urethane based coating compositions containing (A) an isocyanate group-containing adduct of (a) an acrylic or methacrylic hydroxy ester, and (b) a polyisocyanate, (B) a polyfunctional hydroxy compound and (C) a photoinitiator. These compositions are cured by radiation followed by reaction with water vapour. There is no indication that reaction with water vapour could precede the irradiation.

The use of both irradiation and vapour permeation curing is also described in U.S. Pat. No. 4,289,798. In this patent a liquid resinous composition is at least partly cured by radiant energy, treated with a corona discharge to reduce gloss, and is then exposed to radiant energy and optionally moisture to complete the cure. There is no indication that treatment with moisture alone could be used to partially cure the composition to a solid but still photocurable layer which can be exposed imagewise to actinic radiation to cure the exposed areas, leaving unexposed areas soluble in a developer.

The use of water vapour to partially cure a composition is disclosed in U.S. Pat. No. 4,073,975. In this patent a polyurethane composition is prepared from a cycloaliphatic diisocyanate, a polyalkylene ether polyol, and a polyester polyol. This is applied as a coating to a carrier, treated with water vapour to effect delustring and partial curing, and the cure is completed by heating. The use of irradiation is not envisaged.

The use of alkaline vapour to cure coatings other than isocyanate-containing materials is described in U.S. Pat. Nos. 2,710,815 and 3,085,897. In the first of these a solution containing a protein, such as gelatin, and a water-soluble aluminium salt is hardened by contact with ammonia gas. In the second, an emulsion resulting from the emulsion polymerisation of an ethylenically unsaturated monomer and a carboxyl-containing monomer is applied to a surface and fumed with nitrogenous alkaline gas, such as ammonia.

In U.S. Pat. No. 4,389,433 there is described a process for curing monomeric acrylates and methacrylates by mixing these monomers with a hydroperoxide free radical initiator and exposing the mixture to sulphur dioxide at ambient temperature for a few seconds. Suitable free radical initiators include hydrogen peroxide, cumene hydroperoxide, and 2,4-dimethyl-2,4-hexanedihydroperoxide. Suitable monomers include the acrylates and methacrylates of 1,6-hexanediol, trimethylolpropane, polypropylene glycol and allyl alcohol.

In British Patent Application No. 2 010 880 there are described coating compositions comprising a mixture of unsaturated acrylates free from active hydroxy groups together with an isocyanate-terminated prepolymer obtained from a polyester diol-polyester triol mixture and an aliphatic diisocyanate. These compositions are applied to surfaces and may then be passed beneath a U.V. light source to cure and crosslink the unsaturated portion of the coating. Exposure to moisture of the resultant partially-cured coating further chain-extends and crosslinks by reaction of the isocyanate groups. The resultant fully cured coating is tough, glossy, and mar-resistant.

In none of the aforementioned patents and applications is there disclosed a process in which hardening by vapour permeation curing is effected to leave a surface that is still soluble in certain solvents, and complete insolubility is achieved by irradiation—thus enabling image formation to take place.

Accordingly, this invention provides a process for the production of an image which comprises
(a) applying to a substrate a layer of a liquid composition containing a residue that is polymerisable on contact with a gaseous polymerising agent, and a photocurable residue,
(b) contacting the composition with a gaseous polymerising agent such that the layer solidifies but remains photocurable,
(c) exposing the solidified layer to actinic radiation in a predetermined pattern such that exposed parts of the layer are photocured, and
(d) removing those parts of the layer which have not become substantially photocured by treatment with a solvent therefor.

The phrase "exposing in a predetermined pattern" includes both exposure through an image-bearing transparency and exposure to a laser beam moved as directed by a computer to form an image.

The liquid composition that is applied to the substrate in stage (a) of the new process may contain a substance having the polymerisable and the photocurable groups on the same molecule, or it may comprise a mixture of one or more materials that are polymerisable on contact with the gaseous polymerising agent, together with one or more photocurable materials.

The polymerisable residues may themselves comprise a single species or two or more similar species which polymerise under the catalytic influence of the gaseous polymerising agent, or they may comprise two or more co-reacting species that are comparatively stable until reaction between them is catalysed or accelerated by the gaseous polymerising agent.

The gaseous polymerising agent is a substance that either initiates or catalyses polymerisation of a single species, or the copolymerisation of two or more similar species, or acts as a catalyst or accelerator for a polymer-forming reaction between two or more co-reactants. Such materials may be neutral, basic, or acidic, their selection depending upon the nature of the material to be polymerised.

The term 'gaseous' is used solely to denote the physical form in which the polymerising agent contacts the polymerisable species. The term includes not only substances that are gaseous at ambient temperature but also liquid substances that readily form gaseous mixtures when contacted with an inert carrier gas at ambient or elevated temperatures.

For the embodiment in which the gaseous polymerising agent initiates or catalyzes polymerisation or copolymerisation, suitable polymerisable residues and their gaseous polymerising agents include the following: cyanoacrylates with water vapour, ammonia, or an amine, isocyanate, prepolymers, with ammonia or an amine, epoxy resins with boron trifluoride, and phenolic resins with acid gases.

For the embodiment in which the gaseous polymerising agent acts as a catalyst or accelerator for a polymer-forming reaction between two or more co-reactants, suitable polymerisable residues and their gaseous polymerising agents include the following: mixtures of a polyol and an isocyanate with ammonia or an amine, a polyene-polythiol mixture with ammonia or an amine, mixtures of an epoxy resin and an amine with an acid gas, mixtures of an epoxy resin and a thiol with ammonia or an amine, or mixtures of an acrylate or methacrylate and hydrogen peroxide or a hydroperoxide free radical initiator with sulphur dioxide.

Preferred amines that may be used as the gaseous polymerising agent include methylamine, dimethylamine, trimethylamine, ethylamine, diethylamine, triethylamine, isopropylamine, tert.butylamine, ethanolamine, triethanolamine, and N,N-dimethylethanolamine. Suitable acidic gases include hydrogen chloride, hydrogen bromide, sulphur dioxide and sulphur trioxide.

Suitable cyanoacrylates that may be used in the process of this invention include those of formula II

in which $R^2$ has, at most, 18 carbon atoms and is an alkyl, alkenyl aralkyl, haloalkyl, cycloalkyl, aryl or alkoxyalkyl group, especially a methyl, ethyl, allyl, benzyl, chloromethyl, cyclohexyl, phenyl, or ethoxyethyl group.

Mixtures of polyols and isocyanates that may be used include diols, for example alkylene glycols such as ethylene glycol, 1,4-butanediol and bis(hydroxymethyl)cyclohexane, and polyoxyalkylene glycols such as polyoxyethylene and polyoxypropylene glycols having molecular weights from 200 to 5000, triols, for example glycerol, other alkane triols and polyoxyethylene and polyoxypropylene triols having molecular weights from 400 to 4000, hydroxy group-containing reaction products of an epoxy resin with any material having groups that are reactive with epoxide groups, such as carboxylic acid, carboxylic anhydride, phenolic hydroxyl, primary or secondary amino, and thiol groups, pentaerythritol and hydroxy group-containing polymers of hydroxyalkyl acrylates and methacrylates and copolymers of styrene and allyl alcohol; with aliphatic, cycloaliphatic and aromatic isocyanates such as hexamethylene diisocyanate, trimethyl hexamethylene diisocyanate, phenylene diisocyanates, toluene diisocyanates, diphenylmethane diisocyanates, dicyclohexylmethane diisocyanates, naphthylene diisocyanates, and isocyanate-terminated prepolymers.

Isocyanate-terminated prepolymers that may be used are those formed by the reaction of a polyol, polyamine, or polycarboxylic acid with an aliphatic, cycloaliphatic or aromatic diisocyanate. Preferred such prepolymers are prepared by reaction of a polyol, especially a polyesterpolyol, polyetherpolyol, an acrylatepolyol or a polycaprolactone having a molecular weight within the range 300–8000, with hexamethylene-1,6-diisocyanate, toluene diisocyanate, or isophorone diisocyanate. Suitable isocyanate-terminated prepolymers are commercially available and some are described in, for example, U.S. Pat. No. 4,173,682. Such isocyanate-terminated prepolymers may be also be polymerised by the action of ammonia or an amine in the absence of any added polyol, as described, for example, in British Patent Application No. 2 093 049.

Suitable polyene-polythiol mixtures are described in British Patent Specification No. 1 293 722. The polyenes usually have a molecular weight of 50 to 20,000 and contain two or more ethylenic or ethynylic bonds capable of participating in a free-radical polymerisation reaction. Preferred polyenes include the reaction product of 1 mole of tolylene diisocyanate with 2 moles of a dialkenyl ether of trimethylol propane, the reaction product of 1 mole of a polymeric diisocyanate with 2 moles of allyl alcohol, the reaction product of 1 mole of polyethylene glycol with 2 moles of tolylene-2,4-diisocyanate and 2 moles of allyl alcohol, polyisoprene, polybutadiene and other unsaturated polymers in which the unsaturation occurs primarily within the main chain of the molecule, compounds having reactive unsaturated carbon to carbon bonds conjugated with adjacent unsaturated groupings, such as polyethylene ether glycol diacrylate, having a molecular weight of about 750, polytetramethylene ether glycol dimethacrylate having a molecular weight of about 1175, and the triacrylate of the reaction product of trimethylolpropane with 20 moles of ethylene oxide, and reaction products of polyepoxides with amines, alcohols, thioalcohols, or acids having aliphatic unsaturation, such as the reaction product of bisphenol A diglycidyl ether ether with allylamine or diallylamine. Especially preferred polyenes are phenols, particularly bisphenols, substituted by 2 or more allyl or methallyl groups.

Suitable polythiols usually have a molecular weight within the range 50–20,000, especially 100–10,000, esters of thioglycollic, alpha mercaptopropionic acid, and beta mercaptopropionic acid with glycols, triols, tetraols, pentaols, or hexols being preferred. Specific examples of the preferred polythiols are ethylene glycol bis(thioglycollate), ethylene glycol bis(beta mercaptopropionate), trimethylolpropane tris(beta mercaptopropionate), pentaerythritol tetrakis(beta mercaptopropionate), and tris(hydroxyethyl)isocyanurate tris(beta mercaptopropionate). Suitable polyene-polythiol mixtures are further described in British Patent Specification No. 1 293 722.

Epoxy resins that may be used in the new process are preferably those containing at least two groups of formula

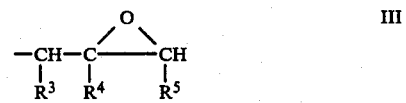

directly attached to an atom or atoms of oxygen, nitrogen, or sulphur, where either $R^3$ and $R^5$ each represent a hydrogen atom, in which case $R^4$ denotes a hydrogen atom or a methyl group, or $R^3$ and $R^5$ together represent $-CH_2CH_2-$, in which case $R^4$ denotes a hydrogen atom.

As examples of such resins may be mentioned polyglycidyl and poly(β-methylglycidyl)esters derived from aliphatic or aromatic polycarboxylic acids, and polyglycidyl and poly(β-methylglycidyl) ethers derived from compounds containing at least two free alcoholic or phenolic hydroxyl groups. Poly(N-glycidyl) derivatives of amines and poly(S-glycidyl) compounds may also be used. Specific preferred epoxide resins are polyglycidyl ethers of 2,2-bis(4-hydroxyphenyl)propane, of bis(4-hydroxyphenyl)methane, or of a novolak formed from formaldehyde and phenol, or phenol substituted in the ring by one chlorine atom or by one alkyl hydrocarbon group containing from one to nine carbon atoms, and having a 1,2-epoxide content of at least 0.5 equivalent per kilogram, bis(4-diglycidylamino)methane, and p-(diglycidylamino)phenyl glycidyl ether.

Epoxide resins in which some or all of the epoxide groups are not terminal may also be used, especially cycloaliphatic resins such as vinylcyclohexene dioxide, limonene dioxide, dicyclopentadiene dioxide, 4-oxatetracyclo[6.2.1.0$^{2,7}$.0.$^{3,5}$]undec-9-yl glycidyl ether, 1,2-bis(4-oxatetracyclo[6.2.1.0$^{2,7}$.0.$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexyl)-8,9-epoxy-2,4-dioxaspiro[5,5]undecane, and epoxidised butadienes or copolymers of butadienes with ethylenic compounds such as styrene and vinyl acetate.

Epoxy resin-thiol mixtures that may be used in the present process are preferably mixtures of those epoxy resins and polythiols that are described above. Amines suitable for use in epoxy resin-amine mixtures in the present process are usually tertiary and may be aliphatic, alicyclic, unsaturated heterocyclic, or araliphatic amines, typically N,N,N',N'-tetramethyl ethylene, propylene, or butylene diamines, trialkyl monoamines such as triethylamine, trialkanolamines such as triethanolamine, N,N'-dimethylpiperazine, triethylenediamine, hexamethylenetetramine, pyridine, quinoline, benzyldimethylamine, and 2,4,6-tris(dimethylaminomethyl)phenol.

Phenolic resins that may be used in the process of this invention are resoles made from a phenol, particularly phenol itself or an alkyl phenol having from 1 to 9 carbon atoms in the alkyl group, and an aldehyde, usually formaldehyde.

Acrylate and methacrylate monomers that may be admixed with hydrogen peroxide or a hydroperoxide and cured by exposure to sulphur dioxide include acrylic and methacrylic acids, alkyl acrylates such as methyl and ethyl acrylates, alkylene diol acrylates such as ethylene and propylene glycol diacrylates, 1,1,1-trimethylol propane triacrylate, polypropylene glycol diacrylate, allyl acrylate, and the corresponding methacrylates. Suitable hydroperoxides include tert.butyl hydroperoxide, cumene hydroperoxide, and 2,4-dimethyl-2,4-hexanedihydroperoxide.

Photocurable residues that may be present include both those in which cure is effected by direct activation of photosensitive groups through irradiation and those in which the irradiation activates a suitable initiator molecule which then activates photopolymerisable groups.

Materials having photosensitive groups are well known and include those having at least two, and preferably three or more, groups which are azido, coumarin, stilbene, maleimido, pyridinone, chalcone, propenone, pentadienone, anthracene, or acrylic ester groups which are substituted in their 3-position by a group having ethylenic unsaturation or aromaticity in conjugation with the ethylenic double bond of the acrylic group.

Materials in which photocure is effected by activation of a photoinitiator which then activates polymerisable groups include epoxide resins, phenolic resins, urea-formaldehyde resins, cyclic ethers, cyclic esters, cyclic sulphides, cyclic amines and organosilicon cyclics in combination with a radiation-sensitive aromatic 'onium salt, such as diazonium, sulphonium, iodonium, and sulphoxonium salts, or a radiation-sensitive aromatic iodosyl salt, and full and partial esters of acrylic and methacrylic acid with aliphatic monohydric alcohols, glycols and higher functional polyols or with a compound containing one or more glycidyl groups, and esters formed by reaction of a polyepoxide with an adduct of a hydroxyalkyl acrylate or methacrylate with a saturated or unsaturated polycarboxylic acid anhydride.

Examples of suitable azides are those containing at least two groups of formula $$N_3Ar— \qquad \qquad IV$$

where Ar denotes a mononuclear or dinuclear divalent aromatic radical containing in all from 6 to at most 14 carbon atoms, especially a phenylene or naphthylene group.

Examples of suitable coumarins are those containing groups of the formula

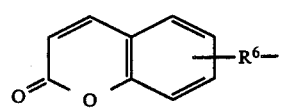

V where $R^6$ is —O—, —COO—, —SO$_2$—, or —SO$_2$O—.

Examples of stilbenes are those with groups of formula

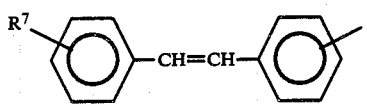

VI where $R^7$ is the residue, containing up to 8 carbon atoms in all, of a five or six-membered nitrogen-containing heterocyclic ring, fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

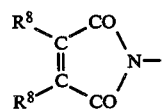

VII where each $R^8$ is an alkyl group of 1 to 4 carbon atoms, a chlorine atom, or a phenyl group, and especially a methyl group.

Examples of those containing pyridinone units are those having groups of the formula

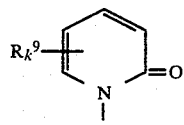   VIII where
$R^9$ is an aliphatic or cycloaliphatic radical of 1 to 8 carbon atoms and
k is zero or an integer of 1 to 4.

Examples of compounds containing chalcone, propenone, and pentadienone groups are those containing groups of formula

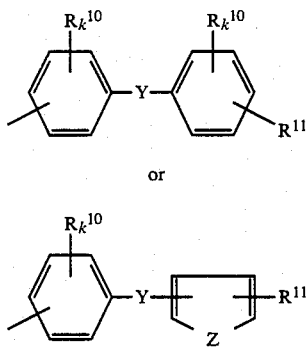

where
each $R^{10}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulphonic, or phosphoric acid group in the form of a salt,
k has the meaning previously assigned,
$R^{11}$ represents a valency bond or a hydrogen atom,
Y represents a grouping of formula

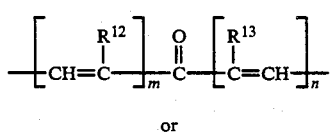   XI or

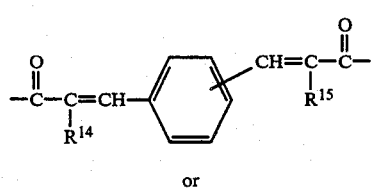   XII or

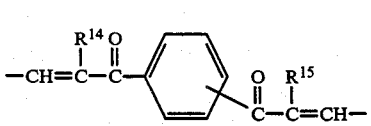   XIII $R^{12}$ and $R^{13}$ are each individually a hydrogen atom, an alkyl group, e.g. of 1 to 4 carbon atoms, or an aryl group, preferably a mononuclear group such as a phenyl group, or $R^{12}$ and $R^{13}$ conjointly denote a polymethylene chain of 2 to 4 methylene groups,
$R^{14}$ and $R^{15}$ are each a hydrogen atom, an alkyl group, e.g., of 1 to 4 carbon atoms, or an aryl group which is preferably a mononuclear group such as a phenyl group,
m and n are each zero, 1, or 2, with the proviso that they are not both zero, and
Z is an oxygen or sulphur atom.

Suitable anthracenes are those containing anthryl groups, such as 1-, 2-, or 9-anthryl groups, which are unsubstituted or have one or two bromo, chloro, methyl or nitro substituents.

Suitable 3-substituted acrylates contain groups of the general formula $$R^{16}CH=C(R^{17})COO-\qquad XIV$$

where
$R^{16}$ is an aliphatic or mononuclear aromatic, araliphatic, or heterocyclic group which, as already indicated, has ethylenic unsaturation or aromaticity in conjugation with the ethylenic double bond shown, such as phenyl, 2-furyl, 2- or 3-pyridyl, prop-2-enyl, or styryl groups, and
$R^{17}$ is a hydrogen, chlorine or bromine atom or an alkyl group of from 1 to 4 carbon atoms.

Specific examples are disorbates of poly(oxyalkylene)glycols, polyvinyl cinnamate and epoxide resin-cinnamic acid reaction products.

Onium salts which, when combined with an epoxide resin or other cationically polymerisable substance, give photopolymerisable mixtures, are described in U.S. Pat. Nos. 4,058,400 and 4,058,401. Suitable sulphoxonium salts that may be used for the same purpose are disclosed in U.S. Pat. Nos. 4,299,938, 4,339,567 and 4,383,025.

Suitable aromatic iodosyl salts which, when combined with a cationically polymerisable substance, give a photopolymerisable mixture, are those of formula $((Ar^1)(Ar^2)+IO)_tX^{t-}$,
where
$Ar^1$ and $Ar^2$, which can be the same or different, each represent a monovalent aromatic radical of 4 to 25 carbon atoms,
$X^{t-}$ denotes a t-valent anion of a protic acid, and
t denotes 1, 2 or 3.

Preferably $Ar^1$ and $Ar^2$ are each phenyl, optionally substituted on each of the phenyl rings by an alkyl group of 1 to 4 carbon atoms, a halogen atom or a nitro group.

The anion $X^{t-}$ is selected to give effective curing. Matching a cationically polymerisable material with a suitable anion is well within the knowledge of those skilled in the art of curing or polymerising cationically polymerisable compositions. For example, salts containing anions derived from organic carboxylic acids, organic sulphonic acids, and inorganic acids, especially acetates, trifluoroacetates, methanesulphonates, benzene-sulphonates, toluene-p-sulphonates, trifluoromethanesulphonates, fluorides, chlorides, bromides, iodates, perchlorates, nitrates, sulphates, hydrogen sulphates, phosphates or hydrogen phosphates are useful in curing phenoplasts, such as phenol-formaldehyde resins, and aminoplasts, such as urea-formaldehyde resins.

Salts containing a pentafluorohydroxoantimonate anion or a metal halogenide or metalloid halogenide anion of formula $MQ_w^-$, where M represents an atom or a metal or metalloid,
Q represents a halogen atom,
w is an integer of from 4 to 6 and is one more than the valency of M, are useful in curing epoxide resins or episulphide resins.

Preferred anions of formula $MQ_w^-$ are hexafluoroantimonate, hexachloroantimonate, hexafluoroarsenate, tetrachloroferrate, hexachlorostannate, tetrafluoroborate or hexafluorophosphate, the two last-named being especially preferred.

Full and partial esters of acrylic and methacrylic acid that may be used as the photocurable residue in the present process contain at least one group of formula

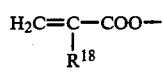    XV where
$R^{18}$ denotes a hydrogen atom or a methyl group.

Preferably these are esters of glycols, such as ethylene glycol, triethylene glycol, and tetraethylene glycol, and esters formed by reaction of acrylic or methacrylic acid with a mono- or poly-glycidyl ether of a mono- or poly-hydric alcohol or phenol or a N-glycidylhydantoin. Other suitable esters are formed by reaction of an adduct of a hydroxyalkyl acrylate or methacrylate and an anhydride, especially succinic, maleic, or phthalic anhydride, with an epoxy resin. Typical esters include 1,4-bis(2-hydroxy-3-acryloyloxypropoxy)butane, a poly(2-hydroxy-3-acryloyloxypropyl)ether of a phenol formaldehyde novolak, 2,2-bis(4-(2-hydroxy-3-(2-acryloyloxyethoxy)-succinyloxypropoxy)phenyl)propane, 1-(2-hydroxy-3-acryloyloxypropoxy)-butane, -octane, and -decane, bis(2-hydroxy-3-acryloyloxypropyl)adipate, 2-hydroxy-3-acryloyloxypropyl propionate, and 3-phenoxy-2-hydroxypropyl acrylate, and the corresponding methacrylates.

As indicated above, the polymerisable group or groups and the photocurable group or groups may form part of the same molecule. For example, epoxides containing photocurable groups can be used in embodiments of the invention described above which utilise an epoxide, and hydroxyl-substituted compounds containing a photocurable group can be used in embodiments utilising a mixture of a polyol and an isocyanate. Suitable dual-functional materials may be made by introducing one or more ethylenically unsaturated groups, such as acrylic, methacrylic or cinnamic ester groups or chalcone groups, into a compound that contains one or more polymerisable groups such as epoxy groups, or one or more groups that will react with a different reactive group on another molecule to form a polymer, such as mercapto or hydroxyl groups. Such introduction of ethylenically unsaturated groups may be effected by ester formation, using, for example, acrylic, methacrylic or cinnamic acid or a chalcone group-containing carboxylic acid and a hydroxyl or mercapto group-containing compound or an epoxide in such proportions that the product contains at least one unreacted hydroxyl, mercapto or epoxide group. Of course, where acrylic, methacrylic or cinnamic acid is reacted with an epoxide resin, all of the epoxide groups of the resin can be reacted, the hydroxyl groups formed by opening of the epoxide rings providing the reactive hydroxyl functionality for use in the process of this invention.

Other suitable dual-functional materials including hydroxy-substituted chalcones, hydroxyphenyl-substituted propenones and pentadienones, hydroxy-substituted maleimides and hydroxy-substituted pyridinones. Especially preferred dual functional materials include glycidyl acrylate, glycidyl methacrylate, and acrylate, methacrylate and cinnamate group-containing ethers and esters of phenolic resoles and epoxide resins, including fully reacted products of acrylic, methacrylic and cinnamic acids with epoxide resins such as polyglycidyl ethers of polyhydric alcohols and phenols, including novolaks, and partial reaction products of these reactants such as 2-(4-glycidyloxyphenyl)-2-(4-(3-acryloyloxy-2-hydroxypropoxy)phenyl)propane, 2-(4-glycidyloxyphenyl)-2-(4-(2-hydroxy-3-methacryloyloxy)propoxy)-phenyl)propane, 1-glycidyloxy-4-(3-acryloyloxy-2-hydroxypropyloxy)butane and 1-glycidyloxy-4-(2-hydroxy-3-methacryloyloxypropyloxy)butane.

In order to obtain the best possible images by the new process, it is preferred that the polymerisation stage and the photocuring stage are effected through different chemical processes. Therefore, for example, when the first stage is carried out by exposure of a phenolic resin to acidic vapour, the second stage should preferably not involve reaction of a phenolic resin with an acid liberated as a result of irradiation of an initiator molecule.

The method by which contact between the liquid composition and the gaseous polymerising agent is achieved is not critical. Usually the substrate bearing the liquid composition is placed within a chamber and air in the chamber is replaced by, or saturated with, the gaseous polymerising agent. However, when the gaseous polymerising agent is atmospheric moisture, all that may be required is to leave the coated substrate exposed to atmospheric moisture at ambient temperature until solidification occurs.

Photocuring may be effected by radiation in the presence of a suitable catalyst. Like the photocurable compounds, the catalysts fall into two main classes—

(i) those which, on irradiation, give an excited state that leads to formation of free radicals which then initiate curing of the monomer (photoinitiators) and (ii) those which, on irradiation, give an excited state that in turn transfers its excitation energy to a molecule of the monomer, giving rise to an excited molecule of the monomer which then crosslinks with an unexcited molecule of the monomer (photosensitisers).

The first class includes organic peroxides and hydroperoxides, α-halogen substituted acetophenones, benzoin and its alkyl ethers, α-methylbenzoin, benzophenones, O-alkoxycarbonyl derivatives of an oxime of benzil or of 1-phenylpropane-1,2-dione, benzil ketals, e.g. its dimethyl ketal, substituted thioxanthones, e.g., 2-chlorothioxanthone and 2-isopropylthioxanthone, anthraquinones, and mixtures of phenothiazine dyes or quinoxalines with electron donors, these initiators being used with unsaturated esters, especially acrylates and methacrylates.

The second class includes 5-nitroacenaphthene, 4-nitroaniline, 2,4,7-trinitro-9-fluorenone, 3-methyl-1,3-diaza-1,9-benzanthrone, and bis(dialkylamino)benzophenones, especially Michler's ketone, i.e., 4,4'-bis(dimethylamino)benzophenone.

Suitable carriers on which the liquid composition may be polymerised and cured in accordance with this invention are metals, particularly copper and aluminium, fiber reinforced composites, optionally faced with a metal, and silicon wafers.

In the third stage of the process, actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual compounds used, the proportion of these compounds in the composition, the type of light source, and its distance from the composition. Suitable times may be readily determined by those familiar with photocuring techniques.

After irradiation, those parts not exposed are washed away by means of a solvent such as cyclohexanone, ethanol, 2-ethoxyethanol, toluene, acetone, and mixtures thereof and aqueous acids and bases such as dilute hydrochloric acid, aqueous sodium carbonate or sodium hydroxide. Thus, the compositions of this invention may be used in the production of printing plates and printed circuits. Methods of producing printing plates and printed circuits from photocurable compositions are well known.

The following Examples illustrate the invention. All parts and percentages are by weight, unless stated otherwise.

The resins used in these Examples are prepared as follows:

Resin I

A 2,2-bis(4-hydroxyphenyl)propane based epoxy resin having an epoxide content of 1.6 equivalents/kg (100 g) and 2,6-di-tert.butyl-4-methylphenol (0.1 g) are heated until molten, stirred together and heated to 130° C. To this mixture there is slowly added, over 30 minutes, a mixture of acrylic acid (10.7 g), chromium(III)tris octanoate (0.05 g) and 2,6-di-tert.butyl-4-methylphenol (0.2 g). On complete addition the mixture is stirred at 130° C. for a further 2 hours and cooled. The product has an epoxide content of 0.07 equivalents/kg.

Resin II 2,2-Bis(4-glycidyloxyphenyl)propane, having an epoxide content of 5.1 equivalents/kg (100 g), and 2,6-di-tert.butyl-4-methylphenol (0.1 g) are stirred together and heated to 100° C. To this mixture there is added slowly, over 1½ hours, a mixture of acrylic acid (19.9 g), chromium(III)tris octanoate (0.05 g) and 2,6-di-tert.butyl-4-methylphenol (0.2 g). On complete addition the mixture is stirred at 100° C. for a further 7 hours and cooled. The product has a negligible epoxide content.

Resin III

A mixture of an epoxy novolak resin (100 parts) having an epoxide content of 5.61 equiv. per kg. and being a polyglycidyl ether made from a phenol-formaldehyde novolak of average molecular weight 420, 2,6-di-t-butyl-p-cresol (0.2 part) and chromium III tris octanoate (0.1 part) is heated to 120° C. and cinnamic acid (83 parts) is added over a period of 1 hour. Heating is continued for a further 3½ hours at 120° C. and the mixture is then allowed to cool. The product becomes solid at room temperature and has a negligible epoxide content.

Resin IV

This denotes a 2,2-bis(4-glycidyloxyphenyl)propane, having an epoxide content of 5.1 equivalents/kg.

Resin V

This denotes 1,4-butanediol diglycidyl ether.

Resin VI

This denotes 3,4-epoxycyclohexylmethyl 3',4'-epoxycyclohexane carboxylate.

Resin VII

A mixture is prepared containing 80% phenol (20.84 parts), formalin solution (38.3% formaldehyde; 22.22 parts), and zinc acetate (1.94 parts) and this is heated under reflux for 2½ hours. The solution is cooled and the aqueous phase separated, leaving 22.35 parts of a phenolic resole. This is washed with saturated brine, and then twice with water. The resole has a viscosity at 25° C. of 3.15 Pa s.

This resole (20 parts) is mixed with tetramethylammonium chloride (0.04 part) and 2,6-di-tert.butyl-4-methylphenol (0.055 part) and heated to 80° C. Glycidyl methacrylate (7.37 parts) is added over 1 hour and, on complete addition, heating is continued for 10¾ hours. The product, a 3-methacryloyl-2-hydroxypropylether of a phenolic resole, has a viscosity at 25° C. of 14.75 Pa s, and a negligible epoxide content.

Resin VIII 1,4-Butanediol diglycidyl ether (5 parts) and tetramethylammonium chloride (0.02 part) are heated together to 120° C. and then treated by addition over 15 minutes of 1,5-di-(4-hydroxyphenyl)penta-1,4-dien-3-one (7.42 parts). The mixture is heated at the same temperature for a further 2½ hours, by which time the epoxide content of the mixture has fallen to a negligible value. Glutaric anhydride (1.06 parts) is added and the mixture heated for a further 2 hours at 120° C. The product, an acid group-containing photocurable resin, has an infra-red spectrum that shows the complete absence of anhydride groups.

Resin IX

This denotes 4,4'-diphenylmethane diisocyanate.

Resin X

This denotes a commercial mixture of trimethyl hexamethylene diisocyanates.

Resin XI

This denotes 1,1,1-trimethylolpropane trisacrylate.

Resin XII

This denotes a commercially available isocyanate terminated prepolymer formed by reaction of a polytetramethylene glycol having an average molecular weight of about 500 with toluene-2,4-diisocyanate, and having an available isocyanate content of 9.45%.

EXAMPLE 1

Resin I (3 parts) is dissolved in methyl 2-cyanoacrylate (2 parts) to form a clear solution. Benzil dimethyl ketal (0.05 parts) is added to give a solution that is stable when stored under dry conditions. The solution is coated as a layer 20 μm thick onto a copper-clad laminate, and placed in a chamber of gaseous ammonia for 30 seconds. The coating solidifies to a tack-free layer. This layer is then irradiated for 20 seconds through a negative using a 5000 W metal halide lamp at a distance of 75 cm. On development in acetone an image is obtained.

EXAMPLE 2

Resin II (2 parts) is dissolved in ethyl 2-cyanoacrylate (1 part) and benzil dimethyl ketal (0.09 part) is added. The resultant clear solution is applied as a layer 20 μm thick to a copper clad laminate. This is placed in a chamber of gaseous ammonia for 30 seconds, rendering the coating tack-free. The solidified coating is irradiated through a negative for 10 minutes using a 32 w/cm medium pressure mercury arc lamp at a distance of 20 cm. Development with a 9:1 by volume mixture of toluene and acetone gives a good image.

EXAMPLE 3

Example 2 is repeated, the coating this time being 45–50 μm thick. After 30 seconds in gaseous ammonia the coating is tack-free and irradiation through a negative for 3 minutes using a 32 w/cm medium pressure mercury arc lamp at a distance of 20 cm gives a good, clear image on development with a 9:1 by volume mixture of toluene and acetone.

EXAMPLE 4

Example 2 is repeated, the coating being 10–15 μm thick and the chamber of gaseous ammonia being replaced by a chamber of air having 80% humidity at 21° C. The coating is tack-free after 3 minutes. Irradiation through a negative for 10 seconds using a 5000 W metal halide lamp at a distance of 75 cm, followed by development in toluene, produces a good clear image.

EXAMPLE 5

Resin III (1 part) is dissolved in ethyl 2-cyanoacrylate (1 part) and p-toluene sulphonic acid (0.2 part) and 4,4'-bis(dimethylamino)benzophenone (0.1 part) are added. This solution is coated onto a copper clad laminate to leave a film 10 μm thick and this is placed inside a chamber of gaseous ammonia for 2 minutes. The film becomes tack-free. The solidified layer is irradiated for 5 minutes through a negative using a 5000 W metal halide lamp at a distance of 75 cm. Development in a 9:1 by volume mixture of xylene and acetone gives a good image.

EXAMPLE 6

Resin IV (1 part) is mixed with ethyl 2-cyanoacrylate (1 part), diphenyliodonium hexafluorophosphate (0.2 part), and 2-isopropylthioxanthone (0.05 part), and applied as a coating 10 μm thick onto a copper clad laminate. The coating is solidified to a tack-free film by contact with gaseous ammonia for 10 seconds, and then irradiated through a negative for 40 seconds using a 5000 W metal halide lamp at a distance of 75 cm. Development in a 9:1 by volume mixture of xylene and acetone gives a good image.

EXAMPLE 7

A mixture is prepared containing Resin II (10 parts) Resin IV (5 parts), Resin V (3 parts), Resin VI (2 parts), and benzil dimethyl ketal (0.1 part). The mixture is applied as a coating 30 μm thick to a copper-clad laminate and placed in a chamber filled with a mixture of boron trifluoride and nitrogen (approximately 1:4 by volume). The coating becomes tack-free within 10 seconds. Irradiation through a negative using a 5000 W metal halide lamp at a distance of 75 cm for 10 seconds, followed by development in a 9:1 by volume mixture of toluene and acetone, gives a good image.

EXAMPLE 8

Resin II (1 part) is mixed with toluene-2,4-diisocyanate (1 part) and benzil dimethyl ketal (0.01 part). The mixture is applied as a coating 20 μm thick to a copper-clad laminate and placed in a chamber filled with 10% triethylamine vapour in nitrogen. The coating becomes tack-free within 10 seconds. Irradiation through a negative using a 5000 W metal halide lamp at a distance of 75 cm for 10 seconds, followed by development in a 9:1 by volume mixture of toluene and acetone gives a good image.

EXAMPLE 9

Resin VII (10 parts) is mixed with benzil dimethyl ketal (0.1 part) and applied as a layer 20 μm thick to a copper-clad laminate. The coated laminate is placed in a chamber filled with 10% hydrogen chloride in nitrogen for 2 minutes, rendering the coating tack-free. Irradiation through a negative using a 5000 W metal halide lamp at a distance of 75 cm for 10 seconds, followed by development in toluene, gives a good image.

EXAMPLE 10

Resin VIII (10 parts) and ethyl 2-cyanoacrylate (20 parts) are mixed and coated onto a copper-clad laminate as a layer 20 μm thick. This is exposed for 10 seconds to nitrogen saturated with water vapour at 21° C., giving a tack-free coating. Irradiation through a negative for 30 seconds, using a 5000W metal halide lamp at a distance of 75 cm, followed by development in 2% aqueous sodium hydroxide, gives a good image.

EXAMPLE 11

A mixture is prepared containing Resin IX (50 parts), Resin II (30 parts), Resin XI (20 parts) and benzil dimethyl ketal (3 parts). The mixture is applied as a coating 20 μm thick to a copper-clad laminate and is then placed in a chamber filled with a mixture of 10% by volume of triethanolamine vapour in nitrogen. The coating becomes tack-free within 20 minutes. Irradiation through a negative using a 5000 w metal halide lamp at a distance of 75 cm for 30 seconds, followed by development in a 9:1 by volume mixture of toluene and acetone, gives a good image.

EXAMPLE 12

Example 11 is repeated, the chamber of 10% triethanolamine in nitrogen being replaced with 10% by volume of N,N-dimethylethanolamine in nitrogen. After two minutes the coating is tack-free. Irradiation through a negative for 30 seconds using a 5000 w metal halide lamp at a distance of 75 cm, followed by development in a 9:1 volume mixture of toluene and acetone, produces a good clear image.

EXAMPLE 13

A mixture of Resin X (40 parts), Resin II (40 parts), Resin XI (20 parts) and benzil dimethyl ketal (3 parts) is coated onto a copper-clad laminate to a thickness of 20–25 μm. This is placed in a chamber filled with a mixture of 10% by volume N,N-dimethylethanolamine vapour in nitrogen. The coating is tack-free within 5 minutes. Irradiation through a negative using a 5000 w metal halide lamp at a distance of 75 cm for 25 seconds, followed by development in a 9:1 by volume mixture of toluene and acetone, produces a clear image.

EXAMPLE 14

Resin XII (35 parts), Resin II (35 parts), Resin X (30 parts) and benzil dimethyl ketal (3 parts) are mixed together and then coated onto a copper-clad laminate to a thickness of 6 μm. The coating is exposed to a mixture of 10% by volume triethylamine vapour in nitrogen for 3 minutes to give a tack-free surface. Irradiation through a negative for 1 minute using a 5000 w metal halide lamp at a distance of 75 cm, followed by development in a 9:1 by volume mixture of toluene and acetone, gives a good image.

EXAMPLE 15

2,2-Bis(3-allyl-4-hydroxyphenyl)propane (40 parts), Resin XI (50 parts), Resin II (10 parts), pentaerythritol tetra(thioglycollate) (20 parts) and benzil dimethyl ketal (3 parts) are mixed and then coated onto a copper-clad laminate to give a thickness of 6 μm. The coated laminate is placed in a chamber filled with 10% by volume triethylamine vapour in nitrogen for 30 minutes, rendering the coating tack-free. Irradiation through a negative using a 5000 w metal halide lamp at a distance of 75 cm for 2 minutes gives an image on development in ethanol.

What is claimed is:

1. A process for the production of an image which comprises
    (a) applying to a substrate a layer of a liquid composition containing a residue that is polymerizable on contact with a gaseous polymerizing agent, and a photocurable residue,
    (b) contacting the composition with a gaseous polymerizing agent such that the layer solidifies but remains photocurable,
    (c) exposing the solidified layer to actinic radiation in a predetermined pattern such that exposed parts of the layer are photocured, and
    (d) removing those parts of the layer which have not become substantially photocured by treatment with a solvent therefor.

2. A process according to claim 1, in which the liquid composition comprises a substance having polymerizable groups and photocurable groups on the same molecule.

3. A process according to claim 1, in which the liquid composition comprises a mixture of one or more materials that are polymerizable on contact with the gaseous polymerizing agent, together with one or more photocurable materials.

4. A process according to claim 1, in which the polymerizable residue comprises a single species or two or more similar species which polymerize under the catalytic influence of the gaseous polymerizing agent.

5. A process according to claim 4, in which the polymerizable residue and its gaseous polymerizing agent are selected from the group consisting of
    (i) a cyanoacrylate with water vapour, ammonia, or an amine,
    (ii) an isocyanate-terminated prepolymer with ammonia or an amine,
    (iii) an epoxy resin with boron trifluoride, and
    (iv) a phenolic resin with an acid gas.

6. A process according to claim 5, in which the gaseous polymerizing agent is an amine and is methylamine, dimethylamine, trimethylamine, ethylamine, diethylamine, triethylamine, isopropylamine, tert.butylamine, ethanolamine, triethanolamine or N,N-dimethylethanolamine.

7. A process according to claim 5, in which the gaseous polymerizing agent is acidic and is hydrogen chloride, hydrogen bromide, sulfur dioxide or sulfur trioxide.

8. A process according to claim 1, in which the polymerizable residue comprises two or more co-reacting species that are comparatively stable until reaction between them is catalysed or accelerated by the gaseous polymerizing agent.

9. A process according to claim 8, in which the polymerizable residue, and its gaseous polymerizing agent, are selected from the group consisting of
    (i) a mixture of a polyol and an isocyanate with ammonia or an amine,
    (ii) a polyene-polythiol mixture with ammonia or an amine,
    (iii) an epoxy resin-amine mixture with an acid gas,
    (iv) an epoxy resin-thiol mixture with ammonia or an amine, and
    (v) a mixture of an acrylate or methacrylate and hydrogen peroxide or a hydroperoxide free radical initiator with sulfur dioxide.

10. A process according to claim 9, in which the gaseous polymerizing agent is an amine and is methylamine, dimethylamine, trimethylamine, ethylamine, diethylamine, triethylamine, isopropylamine, tert-.butylamine, ethanolamine, triethanolamine, or N,N-dimethylethanolamine.

11. A process according to claim 9, in which the gaseous polymerizing agent is acidic and is hydrogen chloride, hydrogen bromide, sulfur dioxide or sulfur trioxide.

12. A process according to claim 5, in which the polymerizable residue is
    (i) a cyanoacrylate of formula

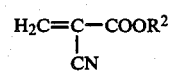

II in which $R^2$ has, at most, 18 carbon atoms and is an alkyl, alkenyl, aralkyl, haloalkyl, cycloalkyl, aryl or alkoxyalkyl group,
    (ii) an isocyanate-terminated prepolymer formed by reaction of a polyol, polyamine, or polycarboxylic acid with an aliphatic, cycloaliphatic or aromatic diisocyanate,
    (iii) an epoxy resin containing at least two groups of formula

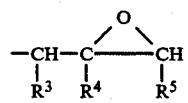

III directly attached to an atom or atoms of oxygen, nitrogen or sulfur, where either $R^3$ and $R^5$ each represent a hydrogen atom, in which case $R^4$ denotes a hydrogen atom or a methyl group, or $R^3$ and $R^5$ together represent —$CH_2CH_2$—, in which case $R^4$ denotes a hydrogen atom, (iv) an epoxy resin having some or all of the epoxide groups in non-terminal positions, (v) a phenolic resin that is a resole made from a phenol and an aldehyde.

13. A process according to claim 9, in which the polymerizable residue is (i) a mixture of an alkylene glycol, a polyoxyalkylene glycol, an alkane triol, a hydroxy group-containing reaction product of an epoxy resin with a carboxylic acid, carboxylic anhydride, phenol, primary or secondary amine, or thiol, pentaerythritol, a hydroxy group-containing polymer of a hydrxoyalkyl acrylate or methacrylate or a copolymer of styrene and allyl alcohol with an aliphatic, cycloaliphatic or aromatic isocyanate, (ii) a mixture of a polyene having a molecular weight of 50 to 20000 and containing two or more ethylenic or ethynylic bonds capable of participating in a free-radical polymerization reaction, or an epoxy resin having at least two groups of formula III

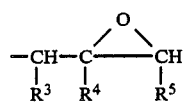

directly attached to an atom or atoms of oxygen, nitrogen or sulfur, where either $R^3$ and $R^5$ each represent a hydrogen atom, in which case $R^4$ denotes a hydrogen atom or a methyl group, or $R^3$ and $R^5$ together represent —CH$_2$CH$_2$—, in which case $R^4$ denotes a hydrogen atom, or having some or all of the epoxide groups in non-terminal positions, with a polythiol having a molecular weight within the range 50 to 20000 which is an ester of thioglycollic, alpha mercaptopropionic or beta mercaptopropionic acid with a glycol, triol, tetraol, pentaol or hexol, (iii) a mixture of an epoxy resin having at least two groups of formula III or having some or all of the epoxide groups in non-terminal positions with an alipatic, alicyclic, unsaturated heterocyclic or araliphatic tertiary amine, or (iv) a mixture of an acrylate or methacrylate monomer which is acrylic or methacrylic acid, or an alkyl acrylate, alkylenediol diacrylate, 1,1,1-trimethylolpropane triacrylate, polypropylene glycol diacrylate, allyl acrylate, or a corresponding methacrylate, with hydrogen peroxide, tert.butyl hydroperoxide, cumene hydroperoxide, or 2,4-dimethyl-2,4-hexane dihydroperoxide.

14. A process according to claim 1, in which the photocurable residue present is one in which cure is effected by direct activation of photosensitive groups through irradiation.

15. A process according to claim 14, in which the residue having photosensitive groups is one having at least two azido, coumarin, stilbene, maleimido, pyridinone, chalcone, propenone, pentadienone, or anthracene groups or acrylic ester groups which are substituted in their 3-position by a group having ethylenic unsaturation or aromaticity in conjugation with an ethylenic double bond of the acrylic group.

16. A process according to claim 1, in which the photocurable residue present is one in which irradiation activates a suitable initiator molecule which then activates a photopolymerizable group.

17. A process according to claim 16, in which the photocurable residue is an epoxide resin, phenolic resin, urea-formaldehyde resin, cyclic ether, cyclic ester, cyclic sulphide, cyclic amine, organosilicon cyclic, a full or a partial ester of acrylic or methacrylic acid with an aliphatic monohydric alcohol, glycol, or higher functional polyol or with a compound containing one or more glycidyl groups, or an ester formed by reaction of a polyepoxide with an adduct of a hydroxyalkyl acrylate or methacrylate with a saturated or unsaturated polycarboxylic acid anhydride.

18. A process according to claim 2, in which the substance having polymerisable and photocurable groups on the same molecule is an epoxide containing a photocurable group, or, together with an isocyanate, a hydroxy compound containing a photocurable group.

19. A process according to claim 1, in which the substrate bearing the liquid composition is placed within a chamber and air in the chamber is replaced by, or saturated with, the gaseous polymerizing agent.

20. A substrate bearing an image produced by a process according to claim 1.

* * * * *